United States Patent
Kopelman

(10) Patent No.: US 8,205,047 B2
(45) Date of Patent: Jun. 19, 2012

(54) METHOD AND APPARATUS FOR REDUCING SIMULTANEOUS SWITCHING OUTPUTS

(75) Inventor: Yaniv Kopelman, Holon (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 575 days.

(21) Appl. No.: 12/047,754

(22) Filed: Mar. 13, 2008

(65) Prior Publication Data

US 2008/0224757 A1 Sep. 18, 2008

Related U.S. Application Data

(60) Provisional application No. 60/894,788, filed on Mar. 14, 2007.

(51) Int. Cl.
*G06F 12/00* (2006.01)
(52) U.S. Cl. .................... 711/154; 365/206
(58) Field of Classification Search ............... 711/154; 365/206
See application file for complete search history.

(56) References Cited

U.S. PATENT DOCUMENTS

| | | | | |
|---|---|---|---|---|
| 6,304,482 B1* | 10/2001 | Lin et al. | | 365/154 |
| 6,810,387 B1* | 10/2004 | Yim | | 705/57 |
| 7,139,691 B1* | 11/2006 | Duong | | 703/19 |
| 7,764,792 B1* | 7/2010 | Avivi et al. | | 380/255 |
| 2003/0125015 A1* | 7/2003 | Inoue et al. | | 455/411 |
| 2005/0076194 A1* | 4/2005 | Kanapathippillai et al. | | 712/241 |
| 2005/0078016 A1* | 4/2005 | Neff | | 341/50 |
| 2006/0171233 A1 | 8/2006 | Fekih-Romdhane et al. | | |

OTHER PUBLICATIONS

Office Action issued Apr. 11, 2011 in Israel Patent Application No. 190185.

* cited by examiner

*Primary Examiner* — Hashem Farrokh

(57) ABSTRACT

The disclosure provides a method for reducing an amount of simultaneous switching outputs (SSO) of a device. The method of reducing the amount of simultaneous switching outputs can include driving outputs of the device to a first set of values, scrambling a second set of values to reduce an amount of simultaneous switching outputs resulting from the switching of the first to the second set of values, and driving the outputs of the device to the scrambled second set of values. Further, the method can include descrambling the scrambled second set of values back to the second set of values.

25 Claims, 6 Drawing Sheets a first circuit 110 and a second circuit 120 coupled by a parallel bus 130. The first circuit 110 may transmit a set of values, such as data bits, control bits, and the like, to the second circuit 120 via the parallel bus 130. The first circuit 110 can include an SSO control unit 140 that can reduce an amount of simultaneous switching outputs resulting from switching from one set of values to another set of values.

METHOD AND APPARATUS FOR REDUCING SIMULTANEOUS SWITCHING OUTPUTS

INCORPORATION BY REFERENCE

This application claims the benefit of U.S. Provisional Application No. 60/894,788, "SSO Scrambler in Parallel Buses" filed on Mar. 14, 2007, which is incorporated herein by reference in its entirety.

BACKGROUND

Simultaneous switching outputs (SSO) can be an issue affecting circuit performance. For example, a semiconductor device can have a plurality of outputs to output a set of values, such as data bits, control bits, and the like. The outputs may connect to another semiconductor device via pads and wirings, which can have large capacitance. In order to drive the large capacitance load rapidly, a large scale driver can be used to provide large current driving capability at each output. When a large number of outputs switch simultaneously from high to low or from low to high, large amounts of current can pass through the semiconductor device in short time. The large spontaneous current can increase spontaneous power consumption. In addition, the large spontaneous current can generate power supply and ground level variance as a result of an inductance effect. Further, the power supply and ground level variance may lead to slew rate variance. Consequently, the power supply and ground level variance and the slew rate variance may harm signal integrity, such as inducing a logic error.

SUMMARY

Aspects of the disclosure provide a method for reducing an amount of simultaneous switching outputs (SSO) of a memory device. The method of reducing the amount of simultaneous switching outputs can include driving outputs of the memory device to a first set of values, scrambling a second set of values to reduce an amount of simultaneous switching outputs resulting from the switching of the first to the second set of values, and driving the outputs of the memory device to the scrambled second set of values. Further, the method can include descrambling the scrambled second set of values back to the second set of values.

To scramble the second set of values, the method can further include scrambling the second set of values based on a key. Accordingly, the method can include descrambling the scrambled second set of values based on the key.

According to an aspect of the disclosure, the key can include a memory address within a memory where at least a portion of the second set of values is to be stored. Accordingly, the method can include storing the scrambled second set of values within the memory at the memory address.

According to another aspect of the disclosure, the method can include storing the key separate from the scrambled second set of values, and associating the scrambled second set of values with the key. Alternatively, the method can include storing the key together with the scrambled second set of values.

Specifically, to scramble the second set of values based on the key, the method can include computing the scrambled second set of values by bit-wise XORing the second set of values and the key.

Aspects of the disclosure also provide an interface that is coupled between a device and inputs/outputs of the device. The interface can include an output driving circuit that is coupled to the outputs of the device, the output driving circuit being configured to drive the outputs of the device to a first set of values, and a scrambler that is coupled between the device and the output driving circuit, the scrambler being configured to receive a second set of values from the device and to scramble the second set of values to reduce an amount of simultaneous switching outputs resulting from the switching of the first to the second set of values, therefore, the output driving circuit drives the outputs of the device to the scrambled second set of values.

Additionally, aspects of the disclosure provide a semiconductor device for reducing simultaneous switching outputs. The semiconductor device can include an output driving circuit that is coupled to outputs of the semiconductor device, the output driving circuit being configured to drive the outputs of the semiconductor device to a first set of values, and a scrambler that is coupled between the semiconductor device and the output driving circuit, the scrambler being configured to receive a second set of values from the semiconductor device and to scramble the second set of values to reduce an amount of simultaneous switching outputs resulting from the switching of the first to the second set of values, therefore, the output driving circuit drives the outputs of the semiconductor device to the scrambled second set of values.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

Figure 1:
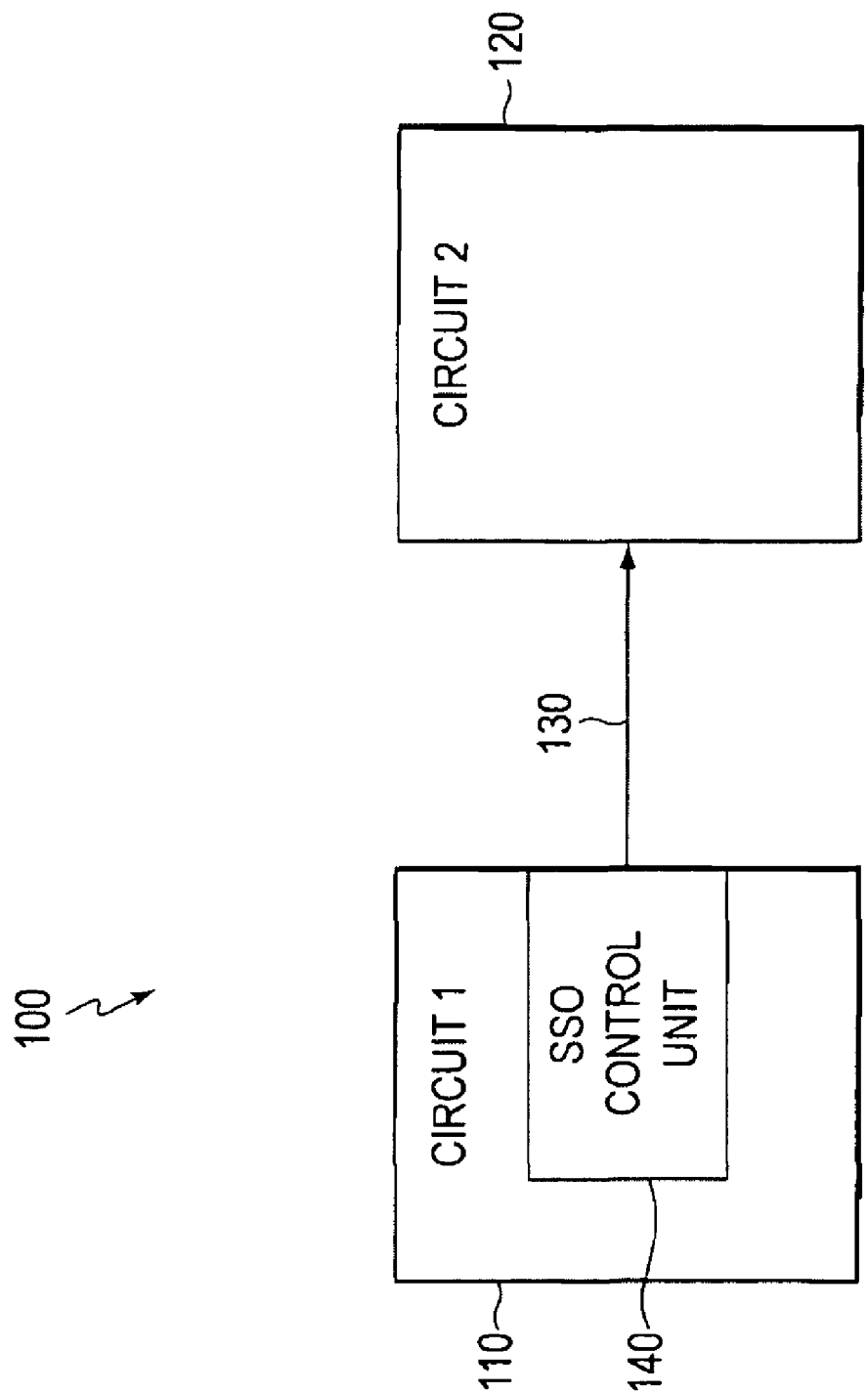
FIG. 1 shows a system example for reducing an amount of simultaneous switching outputs (SSO)

FIG. 1 shows a system example for reducing an amount of simultaneous switching outputs. The system 100 can include a first circuit 110 and a second circuit 120 coupled by a parallel bus 130. The first circuit 110 may transmit a set of values, such as data bits, control bits, and the like, to the second circuit 120 via the parallel bus 130. The first circuit 110 can include an SSO control unit 140 that can reduce an amount of simultaneous switching outputs resulting from switching from one set of values to another set of values.

The first and second circuit 110 and 120 can include any circuits, integrated or discrete, that may use the parallel bus 130 to transmit the set of values. For example, the first and second circuit 110 and 120 can include integrated circuit (IC) blocks, such as application specific IC (ASIC) blocks, memory blocks, digital intellectual property (IP) blocks, CPU blocks, analog IP blocks, and the like, within a semiconductor package. In addition, the first and second circuit 110 and 120 can include IC chips, such as microprocessor chip, memory chip, digital signal processing (DSP) chip, and the like. Further, the first and second circuit 110 and 120 can include printed circuit board (PCB), such as CPU board, memory board, Ethernet board, and the like.

The parallel bus 130 can include various wired parallel connections. For example, the parallel bus 130 can include any connecting techniques within a semiconductor device, such as doped polysilicon lines, metal lines, and the like. In addition, the parallel bus 130 can include connecting techniques for IC chips, such as printed metal lines on a PCB. Further, the parallel bus 130 can include connecting techniques for PCB boards, such as parallel cables that can provide connection among PCB boards. It should be understood that the parallel bus 130 can include combinations of the various wired parallel connections.

While FIG. 1 shows the parallel bus 130 unilaterally transmitting in one direction from circuit 110 to circuit 120, it should be understood that the parallel bus 130 can be configured to bilaterally transmit in both directions, from circuit 110 to circuit 120, and from circuit 120 to circuit 130.

The SSO control unit 140 can perform simultaneous switching output (SSO) control process on a set of values before the parallel bus 130 transmits the set of values. Before the SSO control process, the set of values may result in a large amount of simultaneous switching outputs that may harm performances of circuit 110. After the SSO control process, the processed set of values can result in a reduced amount of simultaneous switching outputs. Subsequently, the processed set of values can be transmitted via the parallel bus 130.

The SSO control unit 140 can include a scrambler according to the disclosure. The scrambler can randomize the set of values before the set of values is transmitted over the parallel bus 130, and thus the amount of simultaneous switching outputs can be reduced.

In an embodiment, the second circuit 120 can include a descrambler that can descramble the scrambled set of values back to the original set of values. In another embodiment, the second circuit may send the scrambled set of values back to the first circuit, and the first circuit can include a descrambler that can descramble the scrambled set of values back to the original set of value. In another embodiment, the second circuit may send the scrambled set of values to a third circuit, the third circuit can include a descrambler that can descramble the scrambled set of values back to the original set of values.

Figure 2:
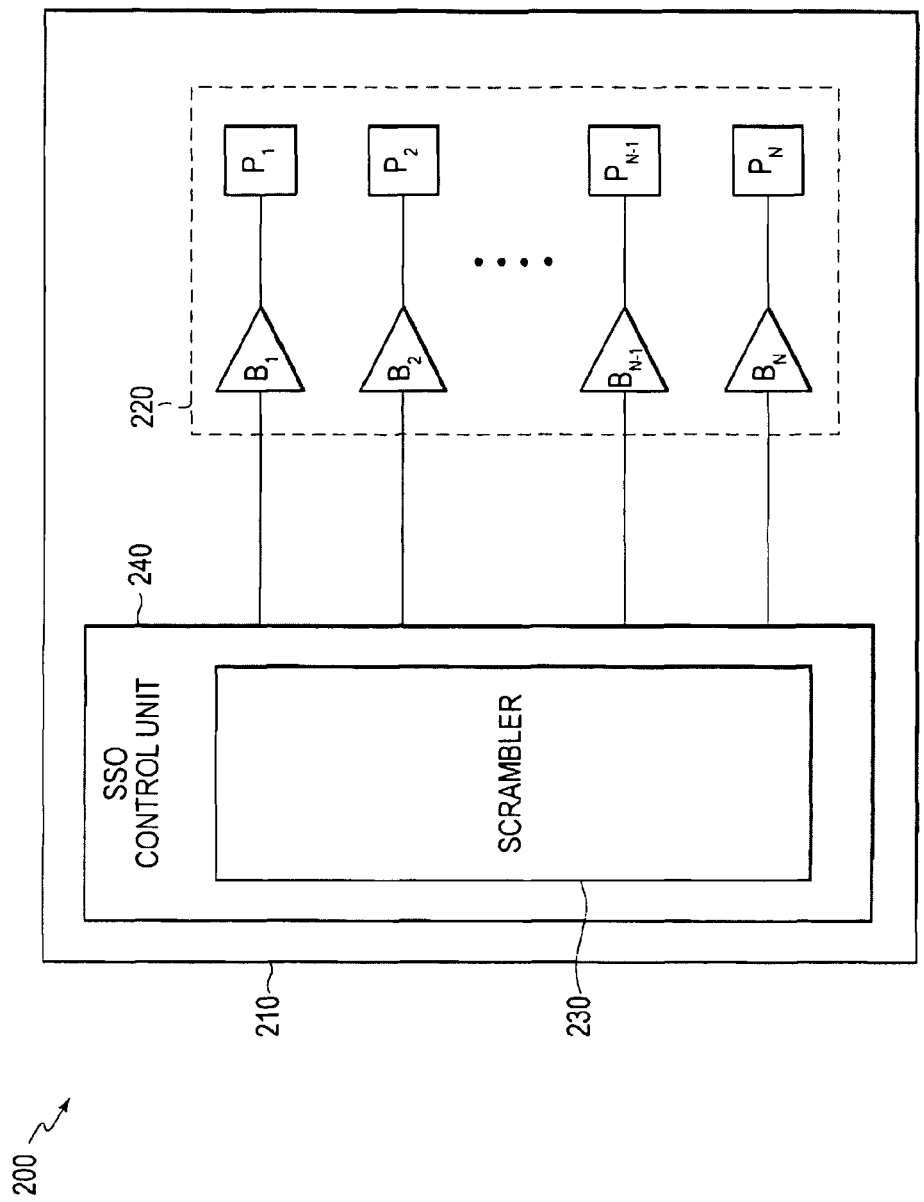
FIG. 2 shows an IC chip example for reducing an amount of simultaneous switching outputs.

FIG. 2 shows an IC chip example for reducing an amount of simultaneous switching outputs. The IC chip 210 can include an output driving circuit 220 and an SSO control unit 240 coupled as shown that can act as an interface. The output driving circuit 220 can include a plurality of outputs, such as $P_1$-$P_N$. The plurality of the outputs $P_1$-$P_N$ can output a set of values to a parallel bus (not shown) outside of the IC chip 210. For example, the parallel bus can include bonding pads, printed metal lines on a PCB that can transmit data to a plurality of inputs of another IC chip. Generally, the bonding pads and the printed metal lines can introduce a relative large capacitance load to the output driving circuit 220 of the IC chip 210. In order to switch an output quickly, a current driver, which can provide large current driving capability, can be used to drive an output. For example, the output driving circuit 220 can include current driver $B_1$-$B_N$. Each current driver can drive an output respectively, with large current to achieve high switching speed.

Consequently, when a large number of outputs switch states, such as from one to zero or from zero to one simultaneously, a large spontaneous current can flow through the IC chip 210. The large spontaneous current can result in large spontaneous power consumption. In addition, the large spontaneous current can generate power supply and ground level variance by an inductance effect. Further, the power supply and ground level variance may lead to slew rate variance. Consequently, when the power supply and ground level variance and the slew rate variance are larger than a tolerable level, they may negatively affect operations of the IC chip 210, such as inducing a logic error. Generally, the power supply, ground level and slew rate variances can be proportional to the number of outputs switching simultaneously. Therefore, reducing an amount of simultaneous switching outputs to a tolerable number can improve circuit performance, such as signal integrity.

To reduce the amount of simultaneous switching outputs to the tolerable number, the SSO control unit 240 can include a scrambler 230. The scrambler 230 can randomize a set of values before the set of values are sent to the output driving circuit 220. Generally, randomized set of values can have a lower number of simultaneous switching outputs when the set of values can result in a large amount of simultaneous switching outputs. In addition, the SSO control unit 240 can include a controller that can control the scrambler. For example, the controller can compare a first set of values at the outputs of the IC chip 210, and a second set of values that will be driven to the outputs. The controller may determine if a scrambling operation is necessary. Further, the controller may determine a scrambling parameter, such as a scrambling seed, that can achieve the tolerable number of simultaneous switching outputs.

Figure 3:
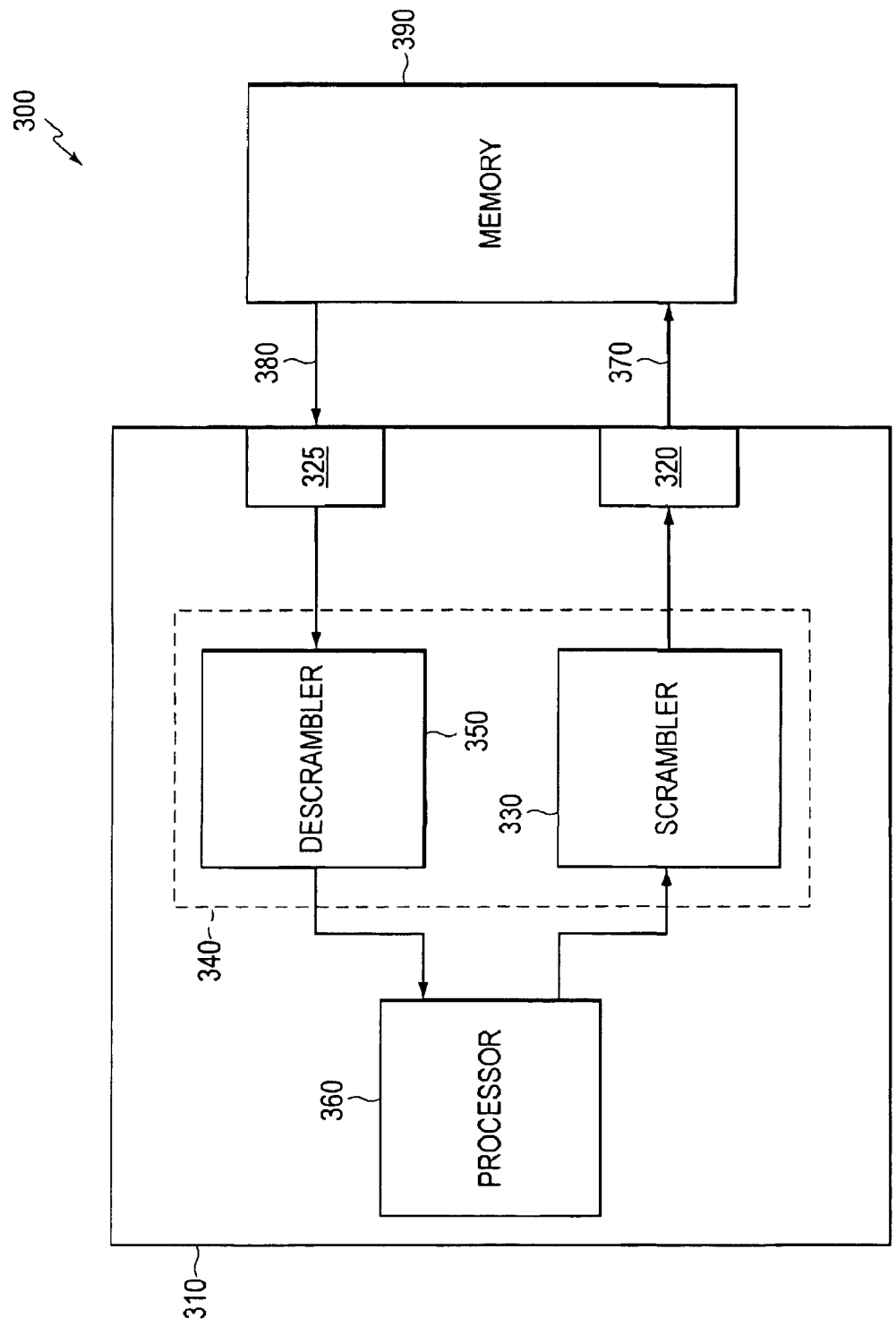
FIG. 3 shows another system example for reducing an amount of simultaneous switching outputs.

FIG. 3 shows another system example for reducing an amount of simultaneous switching outputs. The system 300 can include a processor chip 310 and a memory chip 390 coupled by parallel bus 370 and 380. While the processor chip 310 can have computation capability, the memory chip 390 can have storage capability. The parallel bus 370 can transmit a set of values from the processor chip 310 to the memory chip 390 for storage, and the parallel bus 380 can transmit the set of values from the memory chip 390 to the processor chip 310 for computation.

The processor chip 310 can include a processor 360 that can perform data operation, such as arithmetic operations, logic operations, and the like. While generally the processor chip 310 can include an on-chip memory component (not shown), the on-chip memory component may not have enough storage capability for certain applications. For example, in a busy network, a router may require a large memory to hold received packets to wait for their turns to be forwarded. Therefore, the external memory chip 390 can be necessary. To access the external memory 390, the processor chip 310 can include an output driving circuit 320 and an input circuit 325. The output driving circuit 320 can be coupled to an input interface of the external memory 390 via the parallel bus 370. The input circuit 325 can be coupled to an output interface of the external memory 390 via the parallel bus 380.

As described above, when an amount of simultaneous switching outputs of the processor chip 310 or memory 390 is larger than a tolerable number, the system 300 can have large spontaneous power consumption. Further, the system 300 may have signal integrity issue, e.g. due to such power spikes. In order to control the number of simultaneous switching outputs, the processor chip 310 can include a SSO control unit 340. The SSO control unit 340 can further include a scrambler 330 and a descrambler 350. The scrambler 330 can receive a set of values for storage from the processor 360, scramble the set of values, and send the scrambled set of values to the output driving circuit 320 of the processor chip 310. The descrambler 350 can receive a scrambled set of values from the input circuit 325, descramble the scrambled set of values to its original set of values, and send the descrambled set of values to the processor 360.

It should be understood in view of the foregoing that the memory 390 can include various storage devices that have storage capability, such as SRAM, DRAM, electrical erasable PROM (EEPROM), magnetic storage, optical storage, and the like.

While the parallel bus 370 and 380 are shown as separate buses transmitting data in opposite direction in FIG. 3, it should be understood that a single parallel bus can be configured to transmit data in both directions.

While the scrambler 330 and the descrambler 350 are included in the same processor chip 310, it should be understood that the scrambler 330 and the descrambler 350 can be included in different chips.

During operation of a router system, for example, when the router receives a packet, data of the packet can be stored in the external memory chip 390 to wait for its turn to be forwarded. Therefore, the processor chip 310 can transmit the data of the packet to the memory chip 390 via parallel bus 370 for storage. When its turn to be forwarded comes, the processor chip 310 can retrieve the data of the packet from the memory chip 390 via parallel bus 380, and forward the packet.

During the data transmission from the processor chip 310 to the memory chip 390 or from the memory chip 390 to the processor chip 310, an amount of outputs may switch simultaneously resulting from switching from a first set of values at the outputs to a second set of values at the outputs. To control the number of simultaneous switching outputs to a tolerable number, the second set of values, can be scrambled by the scrambler 330. Subsequently, the scrambled set of values can be transmitted to the memory chip 390 via the parallel bus 370. Generally, when the second set of values would have resulted in a large amount of simultaneous switching outputs, the scrambled set of values results in lower amount of simultaneous switching outputs.

On the other hand, the processor chip 310 may access the memory chip 390 to retrieve the stored set of values. The stored set of values can be received by the input circuit 325. When the received set of values is previously scrambled, the descrambler 350 can descramble the received set of values to recover the original set of values. The recovered set of values can then be packaged in a packet and forwarded by the processor 360.

In an embodiment, the SSO control unit 340 can include a controller (not shown) to control the scrambler 330 to selectively scramble data. For example, the controller can compare a first set of values at the outputs of the processor chip 310 and a second set of values that will be driven to the outputs of the processor chip 310. The controller can determine if a number of simultaneous switching outputs resulting from switching from the first set of values to the second set of values is tolerable. When the number is tolerable, the scrambler 330 can be disabled or bypassed. When the number is not tolerable, the scrambler 330 can be enabled to scramble the second set of values. The scrambled set of values can be marked by setting a flag. Therefore, when the scrambled set of values is retrieved, the descrambler 340 can be enabled to descramble the set of values according to the set flag.

Figure 4:
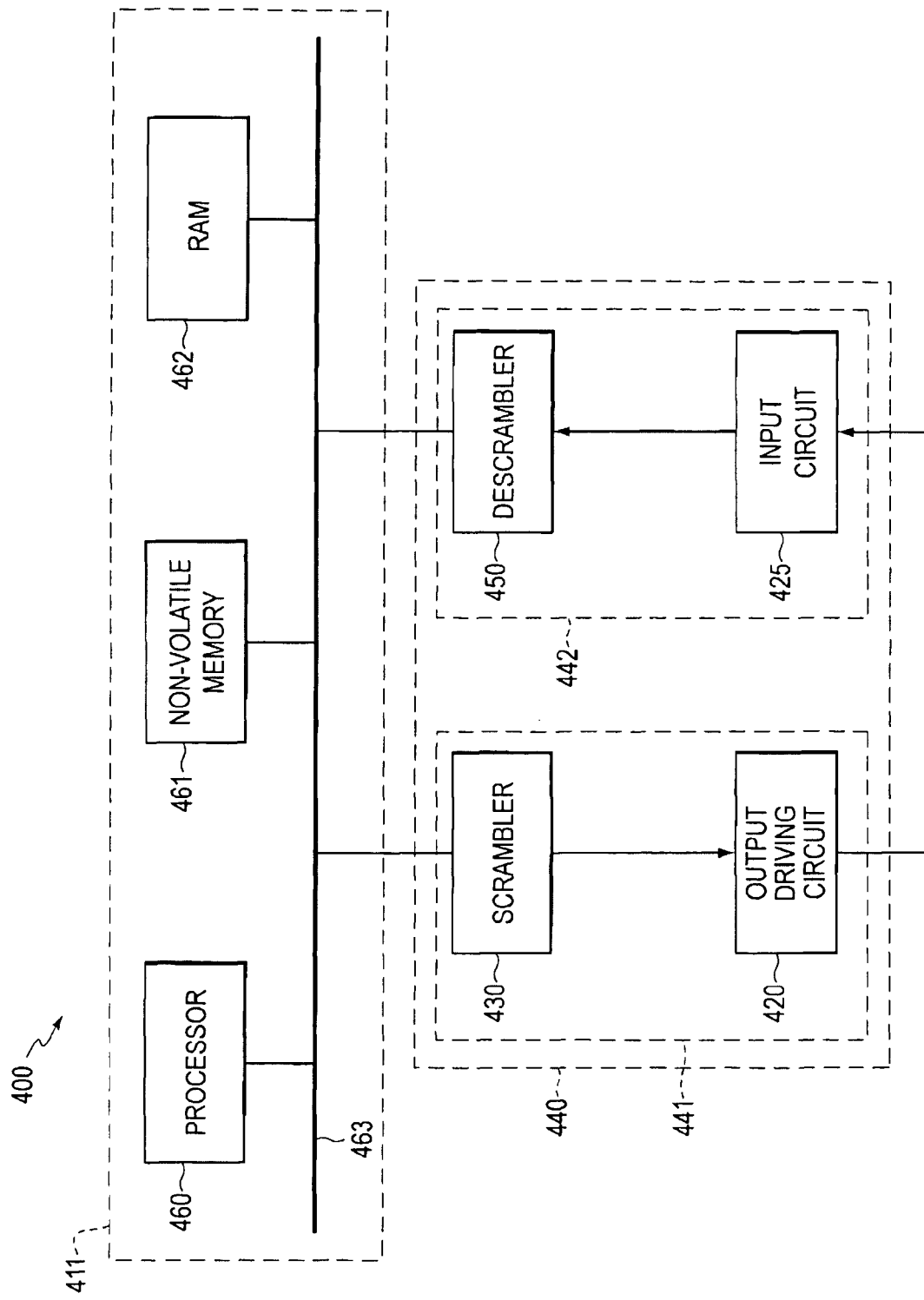
FIG. 4 shows another IC chip example for reducing an amount of simultaneous switching outputs.

FIG. 4 shows another IC chip example for reducing an amount of simultaneous switching outputs. The IC chip 400 can include a main circuit 411 and an interface 440. The main circuit can include a processor unit 460, an on-chip non-volatile memory 461, and an on-chip RAM 462. The interface 440 can provide a communication channel for the main circuit 411 to exchange data with an external chip. For example, the external chip can be an external memory chip, therefore, IC chip 400 can access the external memory chip for extra storage space.

The on-chip non-volatile memory 461 can hold information even when power is off. Therefore, the on-chip non-volatile memory 461 can be used to store system and application codes, such as firmware. The on-chip RAM 462 is readable and writable. The on-chip RAM 462 can have fast access speed. It can be preferred that data and codes are stored in the on-chip RAM 462 during operation, such that the system performance can be improved. However, due to various technology and commercial limits, the on-chip RAM 462 may have limited storage capability. Therefore, external memory may be necessary. The interface 440 can provide the communication channel to access the external memory for the IC chip 400.

The interface 440 can include an output portion 441 and an input portion 442. The output portion 441 can further include a scrambler 430 coupled to an output driving circuit 420. The input portion 442 can further include a descrambler 450 coupled to an input circuit 425. The scrambler 430 and the descrambler 450 can reduce an amount of simultaneous switching outputs for the IC chip 400 when the amount of simultaneous switching outputs is intolerable by circuit performances. The scrambler 430 can scramble a set of values before the set of values is driven to the outputs of the IC chip 400. The descrambler 450 can recover the scrambled set of values back to the original set of values after the scrambled set of value is retrieved from the external memory.

In an embodiment, the interface 440 may further include a controller (not shown) that can control the scrambler 430 and the descrambler 450. For example, the controller can compare a first set of values at the outputs of the IC chip 400 and a second set of values that will be driven to the outputs of the IC chip 400, and determine if a number of simultaneous switching outputs resulting from switching from the first to the second set of values is tolerable, such as below an acceptable level. Further, the controller can control the scrambler 430 to scramble the second set of values when the number of simultaneous switching outputs is intolerable to circuit performance.

The scrambler 430 can be implemented by any existing or later developed scrambling techniques that the scrambled set of values can be recovered to the original set of values by a descrambler. In an embodiment, the scrambler 430 can scramble the set of values based on a key. The key can be stored with the scrambled set of values, therefore, the scrambled set of values can be descrambled based on the same key. Alternatively, the key can be stored separately from the scrambled set of values, such as in a lookup table. The scrambled set of values can be associated with the key, such as attached with a lookup table index of the key. Therefore, the key can be determined and used to descramble the scrambled set of values.

In an example of using external memory for storage, the key can include an address of the external memory. The scrambled set of values can be stored at the external memory according to the address. Further, the scrambled set of values can be descrambled based on the address that stores the scrambled data. In another example, the external memory can include a descrambler that can descramble the scrambled set of values back to the original set of values, therefore, the original set of values can be stored in the external memory.

In another example, the key can include a seed that can be determined by the controller to optimize the scrambler 430 performance. For example, the controller can choose a seed from a lookup table of seeds based on the first set of values on the outputs and the second set of values that will be driven to the outputs. For example, the controller can choose a seed within the lookup table of seeds that can result in a lowest number of simultaneous switching outputs from the first to the second set of values. Then the seed can be included in the key to scramble the second set of values. Consequently, the number of simultaneous switching outputs resulting from switching from the first set of values to the scramble second set of values can be reduced.

It should be noted that the scrambler 430 and the descrambler 450 can be implemented as software stored in the non-volatile memory or RAM, the processor unit 460 can execute the software to perform scrambling and descrambling functions. In addition, the scrambler 430 and the descrambler 450 can be implemented as hardware. Further, the scrambler 430 and the descrambler 450 can be implemented as a combination of software and hardware.

Figure 5:
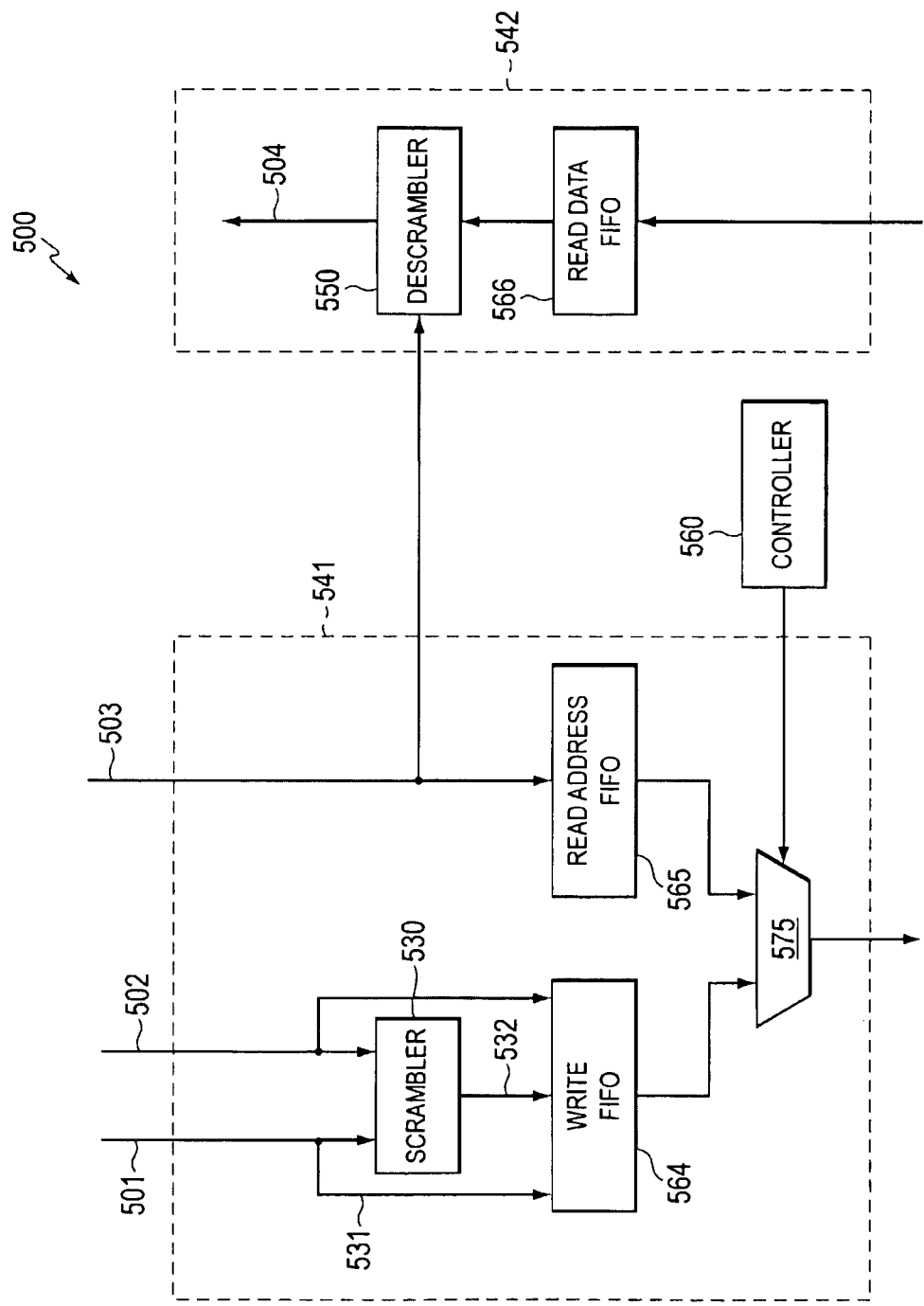
FIG. 5 shows a detailed simultaneous switching outputs (SSO) control unit example.

FIG. 5 shows a detailed simultaneous switching outputs (SSO) control unit example. The SSO control unit 500 can be included in a device that may access an external memory via a parallel bus. The SSO control unit 500 can include an output portion 541 and an input portion 542. The output portion 541 can connect to an output driving circuit of the device to output data and addresses. The addresses can include writing address and reading address. The input portion can connect to an input circuit of the device to receive data from the memory.

In addition, the SSO control unit 500 can include a controller 560 that can provide control signals to various components of the SSO control unit 500 to coordinate their operations. While the controller 560 is shown providing a control signal for simplicity, it should be understood that the controller 560 can provide various control signals to, such as scrambler, descrambler, and the like, to coordinate operations of the SSO control unit 500.

The output portion 541 can receive writing data 501, writing address 502 and reading address 503, and output to the output driving circuit of the device according to the control signals from the controller 560. The output portion 541 can include a scrambler 530, a write first in first out (FIFO) buffer 564, a read FIFO buffer 565 and a MUX 575.

The scrambler 530 can scramble the writing data 501 based on the writing address 502. The write FIFO buffer 564 can buffer the writing address 502, non-scrambled data 501 or scrambled data. The read FIFO buffer 565 can buffer the reading address. The MUX 575 can choose data either from the write FIFO buffer 565 or from the read FIFO buffer 565.

During operation, the output portion 541 can be configured to one of three scenarios. The three scenarios include outputting writing address and non-scrambled writing data; outputting writing address and scrambled writing data; and outputting reading address.

To output the writing address and the non-scrambled writing data, the scrambler 530 can be bypassed by connection 531. Further, the write FIFO 564 can be configured to buffer the writing data 501 and the writing address 502. Further, the MUX 575 can be configured to output values from the writing FIFO 564. Therefore, the output portion 541 can provide writing address and non-scrambled writing data to the output driving circuit of the device.

To output the writing address and the scrambled writing data, the scrambler 530 can be enabled under a control signal of the controller 560. The scrambler 530 can scramble the writing data 501 based on the writing address 502. The scrambled writing data 532 can be buffered by the writing FIFO buffer 564 with the writing address. Further, the MUX 575 can be configured to output the data from write FIFO 564. Therefore, the output portion 541 can provide writing address and scrambled writing data to the output driving circuit.

To output the reading address, the read address FIFO 565 can buffer the reading address 503. Further, the MUX 575 can be configured to output data from the read address FIFO 565. Therefore, the output portion 541 can provide reading address to the output driving circuit.

The input portion 542 can include a read data FIFO 566 and a descrambler 550. The read data FIFO 566 can buffer data received from the input circuit of the device. The descrambler 550 can descramble the read data based on the reading address.

During a writing operation of reducing an amount of simultaneous switching outputs, the writing data can be scrambled based on the writing address for example. Subsequently, the scrambled writing data and the writing address can be buffered and outputted to the output driving circuit. Further the scrambled writing data and the writing address can be transmitted over the parallel bus to the external memory. The external memory can store the scrambled writing data according to the writing address.

During a reading operation of reducing an amount of simultaneous switching outputs, the output portion 541 can be configured to output the reading address 503 to the external memory. The external memory can retrieve the scrambled data stored at the reading address, transmit the data over the parallel bus, and provided the retrieved scrambled data to the input circuit device. The scrambled data can be buffered by the read data FIFO buffer 566. Further, the scrambled data can be descrambled based on the reading address.

It should be noted that the scrambler 530 can use any suitable scrambling technique or algorithm to scramble a set of values that will generally result in a reduced amount of simultaneously switched outputs. Choices of the scrambling algorithms may be determined based upon relative complexity, speed, specifications, as well as other requirements.

Figure 6:
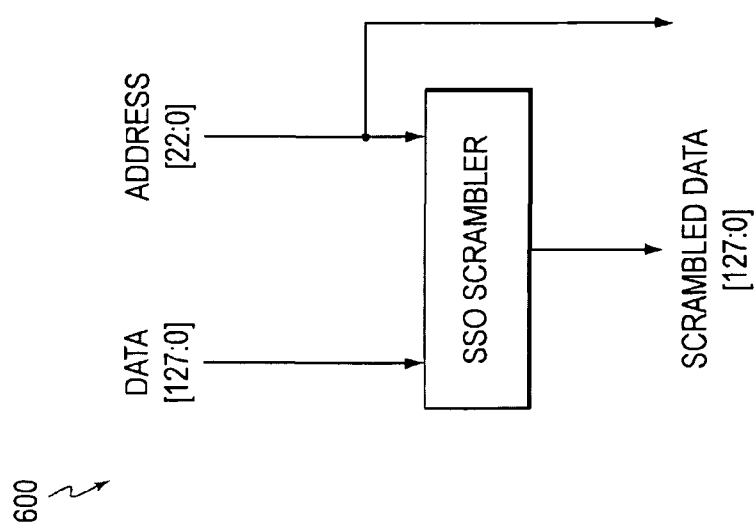
FIG. 6 shows a flow chart outlining a control process example for reducing an amount of simultaneous switching outputs.

FIG. 6 shows a block diagram of a scrambler example. The scrambler 600 can receive a set of values shown as data in FIG. 6, and an address. Further, the scrambler 600 can scramble the set of values based on the address, and output the scrambled set of values. Therefore, the scrambler 600 can be used in a system, such as system 300, that needs to store a set of values at an address in an external memory. The scrambler 600 can scramble the set of values based on the address, and output the scrambled set of values and the address to the external memory. The external memory can then store the scrambled set of values at the address.

More specifically, as shown in FIG. 6, the scrambler 600 can receive the set of values having a length of 128 bits and the address having a length of 23 bits for example. In an embodiment, the scrambler 600 can generate a 128-bit key based on the 23-bit address. For example, the 128-bit key can be generated by combining the 13 lowest significant bits (LSB) of the address with five times of the 23-bit address, as illustrated by equation 1:

$$\text{Key}[127:0]=\{\text{Addr}[12:0],\text{Addr}[22:0],\text{Addr}[22:0],\text{Addr}[22:0],\text{Addr}[22:0],\text{Addr}[22:0]\} \quad (1)$$

where Addr[12:0] denotes the 13 LSB of the address, Addr[22:0] denotes the 23-bit address, and Key[127:0] denotes the generated 128-bit key.

Further, the scrambler 600 can scramble the set of values having 128-bit based on the 128-bit key. For example, the scrambler 600 can scramble the set of values by a bit-wise XOR operation of the set of values and the key, as illustrated by equation 2:

$$\text{ScrambledData}[127:0]=\text{Data}[127:0]\char`\^\text{Key}[127:0] \quad (2)$$

where Data[127:0] denotes the set of values having 128-bit, and ScrambledData[127:0] denotes the scrambled set of values having 128-bit. Therefore, the scrambled set of values having 128-bit can be provided to the external memory with the 23-bit address. Subsequently, the external memory can stored the scrambled set of values having 128-bit at the address.

Figure 7:
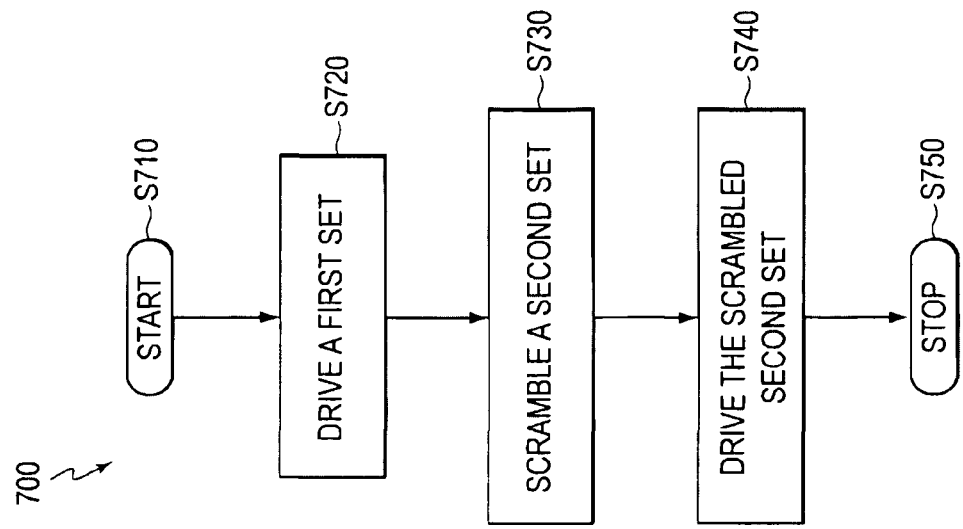
FIG. 7 shows a block diagram of a scrambler example.

FIG. 7 shows a flow chart outlining a control process example 700 for reducing an amount of simultaneous switching outputs. The control process starts at step S710, and proceeds to step S720, where a first set of values is driven to outputs of a circuit. The outputs can be coupled to a parallel bus that can transmit the first set of values to another circuit.

Then, the process proceeds to step S730, where a second set of values can be scrambled to reduce an amount of simultaneous switching outputs resulting from switching from the first to the second set of values. In an embodiment, a controller can be included to compare the first set of values and the second set of values, and decide if the amount of simultaneous switching outputs can harm circuit performance. If the amount of simultaneous switching outputs can harm circuit performance, a scrambler can be enabled to descrambled the second set of values, therefore the amount of simultaneous switching outputs resulting from switching from the first to the scrambled second set of values can be lower. In another embodiment, the second set of values can be scrambled based on a key. According to an aspect of the disclosure, the key can include an address of a memory that can store the second set of values.

Subsequently, the process proceeds to step S740, where the scrambled second set of values can be driven to the outputs. In an embodiment, the scrambled second set of values can be stored in a memory. When the scrambled second set of values is read from the memory, the scrambled second set of values can be descrambled to recover the original second set of values. Then the process proceeds to step S750 and terminates.

While binary bits are used for easy understanding, it should be understood that the embodiments can be modified to work on symbols by those skilled in the art.

While the invention has been described in conjunction with the specific exemplary embodiments thereof, it is evident that many alternatives, modifications, and variations will be apparent to those skilled in the art. Accordingly, exemplary embodiments of the invention as set forth herein are intended to be illustrative, not limiting. There are changes that may be without departing from the spirit and scope of the invention.

What is claimed is:

1. A method of reducing an amount of simultaneously switched outputs of a memory device, comprising:
    driving outputs of the memory device to a first set of values;
    determining an amount of simultaneously switched outputs resulting from switching from the first set of values to a second set of values;
    determining a scrambling seed that results in a lowest amount of simultaneously switched outputs;
    scrambling the second set of values based on the scrambling seed to reduce the amount of simultaneously switched outputs; and
    driving the outputs of the memory device to the scrambled second set of values.

2. The method according to claim 1, further comprising:
    descrambling the scrambled second set of values back to the second set of values.

3. The method according to claim 1, wherein scrambling the second set of values further comprises:
    scrambling the second set of values based on a key.

4. The method according to claim 3, wherein the key includes a memory address within a memory where at least a portion of the second set of values is to be stored.

5. The method according to claim 4, further comprising:
    storing the scrambled second set of values within the memory at the memory address.

6. The method according to claim 3, further comprising:
    storing the key separate from the scrambled second set of values; and
    associating the scrambled second set of values with the key.

7. The method according to claim 3, further comprising:
    storing the key together with the scrambled second set of values.

8. The method according to claim 3, further comprising:
    descrambling the scrambled second set of values based on the key.

9. The method according to claim 3, wherein scrambling the second set of values based on the key, further comprises:
    computing the scrambled second set of values by bit-wise XORing the second set of values and the key.

10. An interface of a device that is coupled to a memory, comprising:
    an output driving circuit that is coupled to outputs of the device, the output driving circuit being configured to drive the outputs of the device to a first set of values;
    a controller that is coupled to the output driving circuit, the controller being configured to determine an amount of simultaneously switched outputs resulting from switching from the first set of values to a second set of values and to determine a scrambling seed that results in a lowest amount of simultaneously switched outputs; and
    a scrambler that is coupled to the output driving circuit, the scrambler being configured to receive the second set of values and to scramble the second set of values based on the scrambling seed to reduce the amount of simultaneously switched outputs,
    wherein the output driving circuit drives the outputs of the device to the scrambled second set of values.

11. The interface according to claim 10, further comprising:
    an input circuit that is coupled to the inputs of the device, the input circuit being configured to receive the scrambled second set of values from the inputs of the device; and
    a descrambler that is coupled between the device and the input circuit, the descrambler being configured to receive the scrambled second set of values from the input circuits, descramble the scrambled second set of values back to the second set of values, and provide the second set of values to the device.

12. The interface according to claim 10, wherein the scrambler is further configured to scramble the second set of values based on a key.

13. The interface according to claim 12, wherein the memory stores the second set of values.

14. The interface according to claim 13, wherein the key includes a memory address of the memory where at least a portion of the scrambled second set of values is stored.

15. The interface according to claim 13, wherein the memory comprises:
    a descrambler configured to descramble the scrambled second set of values back to the second set of values.

16. The interface according to claim 15, wherein the key includes a memory address of the memory where at least a portion of the second set of values is stored.

17. The interface according to claim 12, wherein the key is stored separately from the scrambled second set of values, the scrambled second set of values being associated with the key.

18. A semiconductor device having reduced simultaneously switched outputs, comprising:
- an output driving circuit that is coupled to outputs of the semiconductor device, the output driving circuit being configured to drive the outputs to a first set of values;
- a controller that is coupled to the output driving circuit, the controller being configured to determine an amount of simultaneously switched outputs resulting from switching from the first set of values to a second set of values and to determine a scrambling seed that results in a lowest amount of simultaneously switched outputs; and
- a scrambler that is coupled between the semiconductor device and the output driving circuit, the scrambler being configured to receive the second set of values form the circuit and to scramble the second set of values based on the scrambling seed to reduce the amount of simultaneously switched outputs.

19. The semiconductor device according to claim 18, further comprising:
- an input circuit that is coupled to inputs of the semiconductor device, the input circuit being configured to receive the scrambled second set of values from the inputs of the semiconductor device; and
- a descrambler that is coupled between the semiconductor device and the input circuit, the descrambler being configured to receive the scrambled second set of values from the input circuit, descramble the scrambled second set of values back to the second set of values, and provide the second set of values to the semiconductor device.

20. The semiconductor device according to claim 18, wherein the scrambler is further configured to scramble the second set of values based on a key.

21. The semiconductor device according to claim 20, wherein the outputs of the semiconductor device are coupled to a memory to store the second set of values.

22. The semiconductor device according to claim 21, wherein the key includes a memory address within the memory where at least a portion of the scrambled second set of values is stored according to the memory address.

23. The semiconductor device according to claim 21, wherein the memory comprises:
- a descrambler configured to descramble the scrambled second set of values back to the second set of values.

24. The semiconductor device according to claim 23, wherein the key includes a memory address within the memory where at least a portion of the second set of values is stored according to the memory address.

25. The semiconductor device according to claim 20, wherein the key is stored separately from the second scrambled set of values, the second scrambled set of values being associated with the key.

* * * * *